United States Patent [19]

Narozny et al.

[11] 3,997,229
[45] Dec. 14, 1976

[54] FLEXIBLE CONNECTING MEANS

[75] Inventors: Ronald S. Narozny, Panorama City; Dennis Bossi, La Crescento, both of Calif.

[73] Assignee: Thomas & Betts Corporation, Elizabeth, N.J.

[22] Filed: Sept. 15, 1975

[21] Appl. No.: 613,410

[52] U.S. Cl. ............................. 339/19; 339/17 F
[51] Int. Cl.² ....................................... H01R 31/08
[58] Field of Search ........ 339/4, 19, 17 F, 176 MF, 339/205, 275 B, 275 T

[56] References Cited
UNITED STATES PATENTS

| | | | |
|---|---|---|---|
| 3,601,755 | 8/1971 | Shiells | 339/19 |
| 3,678,437 | 7/1972 | Vaden | 339/17 F |
| 3,731,254 | 5/1973 | Key | 339/19 |

Primary Examiner—Roy Lake
Assistant Examiner—Mark S. Bicks
Attorney, Agent, or Firm—David Teschner; Jesse Woldman

[57] ABSTRACT

A plurality of flat elongate flexible metallic strips are arranged in spaced parallel relationship within a length of flat flexible dielectric material so that the curled tubular ends of the strips are exposed at either end of the dielectric material to provide contact means thereat. Stiffening means which may comprise coined rib portions are interposed between the exposed tubular ends and the central portion of the strips to prevent flexing of the metallic strips at their juncture with each end of the dielectric material.

14 Claims, 11 Drawing Figures

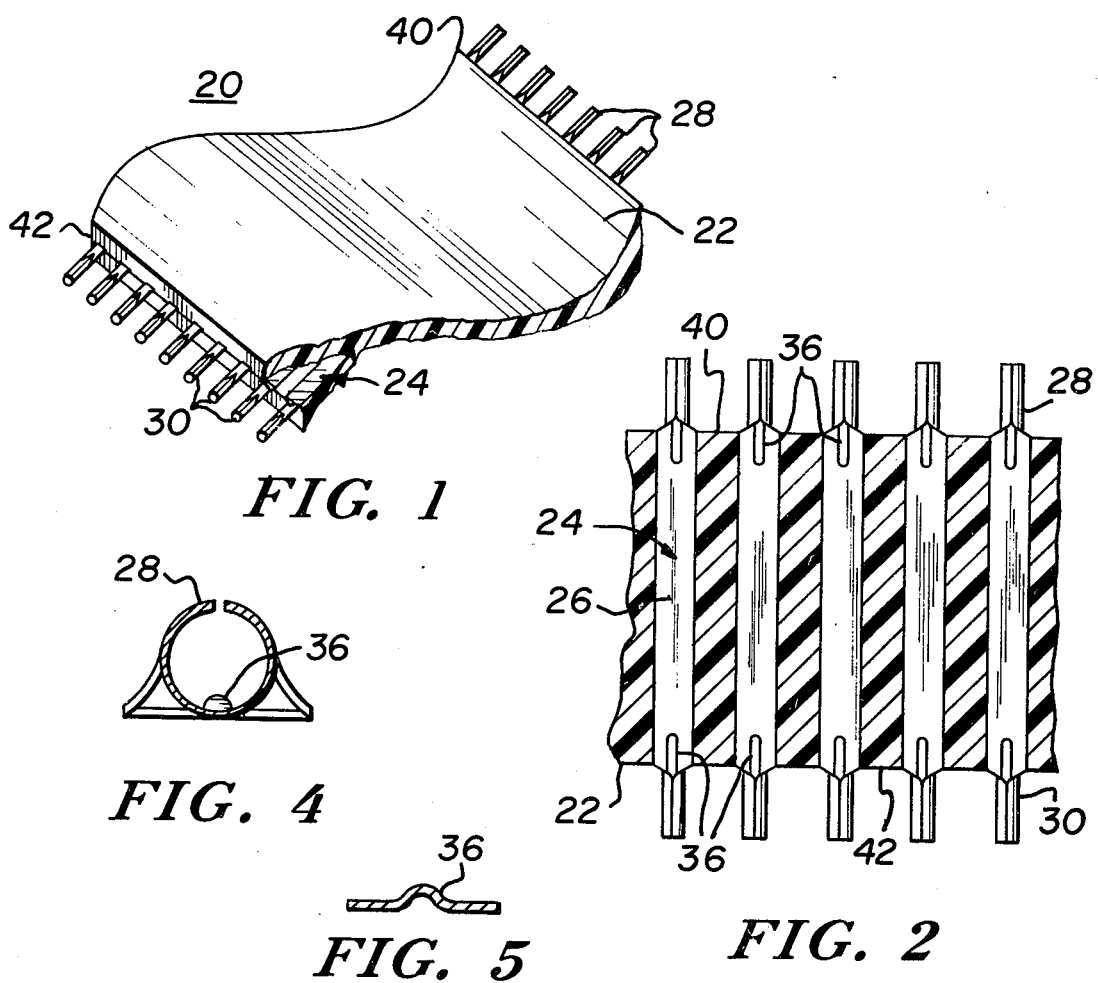

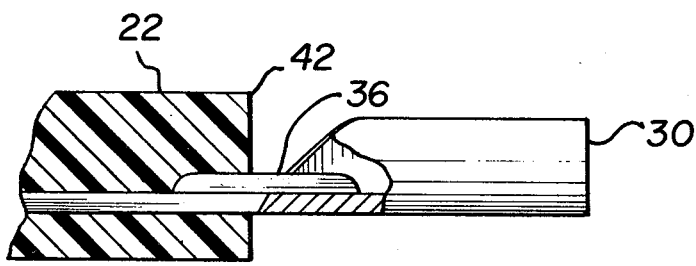
FIG. 7
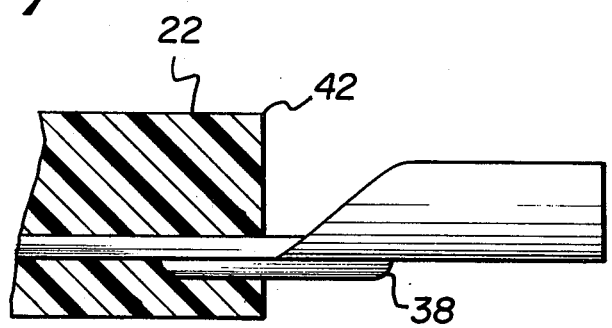
FIG. 8
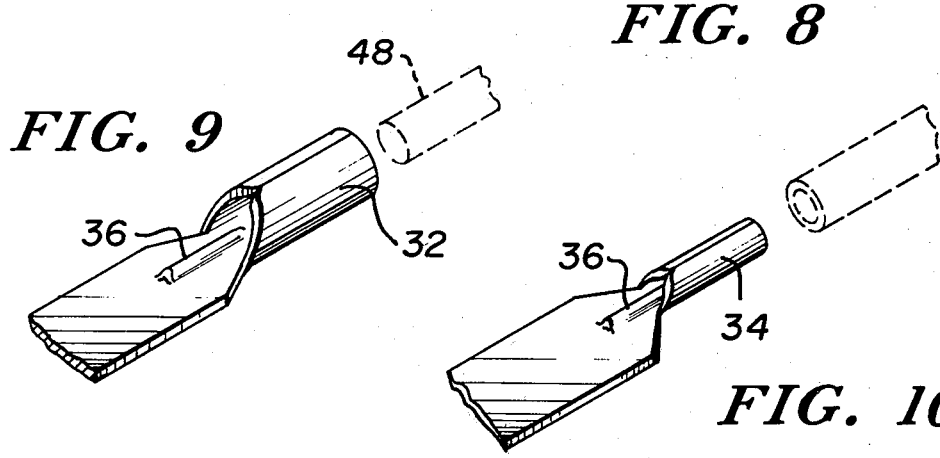
FIG. 9
FIG. 10
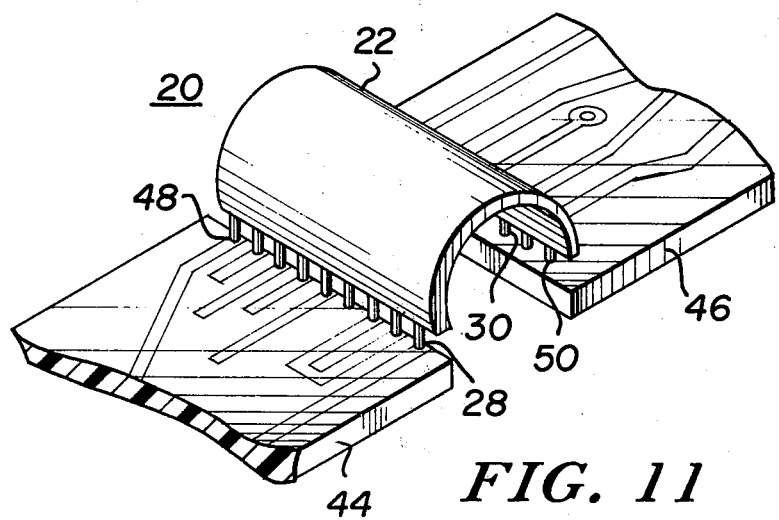
FIG. 11

FLEXIBLE CONNECTING MEANS

BACKGROUND OF THE INVENTION

1. Field of the Invention

The invention is directed to the field of flexible electrical connectors for printed circuit boards and the like.

2. Description of the Prior Art

Prior art insulated flexible jumpers or connectors adapted to interconnect electrical circuits and which may be employed for interconnecting printed circuit boards or the like have been devised and are exemplified in U.S. Pat. No. 2,994,058 issued July 25, 1961 to Dahlgren, and U.S. Pat. No. 3,601,755 issued Aug. 24, 1971 to Shiells and assigned to the assignee of the instant invention. These devices, although generally adequate in certain limited applications where the jumper is not subjected to severe bending or flexure, provide no means for insuring that the exposed contact ends do not bend or flex at the juncture between the contact end and the body of the overlying insulating material. Since the support provided by the insulating material along the length of the central portion of the contact strips ends abruptly at the aforesaid juncture, the remaining exposed length of the contact strip may be readily permanently bent or deformed out of the plane of the insulating material, causing a weakening and subsequent failure or breakage of the contact end thereat. Furthermore, the disruption or disturbance of the planar symmetry of the contacts at either end of the jumper due to such bending or deformation presents a serious problem where the contacts are required to mate with a series of matching apertures or pins in a further member.

SUMMARY OF THE INVENTION

The invention overcomes the limitations and difficulties noted above with respect to prior art devices by providing a contact construction and assembly in a flexible dielectric material which is arranged to permit complete flexure of the resulting flexible connecting means without distortion, bending, or permanent deformation of the exposed contact ends. The flexible dielectric material may comprise a laminate of two or more relatively thin sheets of insulating material, which may include any suitable thermoplastic or thermosetting material conventionally employed in the fabrication of multiconductor flat cable well known in the art. A plurality of flat metallic elongate strips having rolled or curled tubular ends are encased within the flexible insulating material in spaced parallel arrangement so that the thin flexible central portion of the strips is aligned coplanar with the opposing surfaces of the insulating material while the tubular contact ends extend beyond the confines thereof. To prevent flexure or bending of the exposed contacts at their juncture with the terminating ends of the flexible insulating material, each strip is provided with stiffening means interposed between the contact ends and the central portion of the strip and located in such manner as to bisect the junction between the contact end and the adjacent terminating end of the insulating material to provide selective reinforcement of the strip thereat. The stiffening means may comprise a rib or strut which may be displaced out of the plane of the strip and formed integral therewith. Such rib or strut thus extends the support provided by the insulating material into the non-supported exposed section of the metallic strip. The metallic strip is readily, conveniently, and inexpensively manufactured from thin flexible and resilient flat stock having superior electrical properties for use as a conductive element, the strip being die stamped in the flat configuration and suitably rolled formed or otherwise selectively shaped at its ends to provide the desired contact configuration. The reinforcing or stiffening means which may comprise the aforementioned rib or strut may be readily created by a coining or like operation applied to the strip in the manufacturing sequence. The contact strips may then be placed onto a layer of insulating material of given width and transverse to the longitudinal axis thereof and in spaced parallel arrangement with respect to one another in a continuous operation, and a second or overlying layer of insulating material applied thereover and joined to the underlying layer to provide a laminated structure of any suitable length. The finished product may then be supplied in rolls wherein the user may select the length of jumper strip desired and sever the desired portion from the remainder of the roll. It is thus an object of this invention to provide an improved flexible connecting means.

It is another object of this invention to provide means for preventing inadvertent flexure or bending of the exposed contact ends of a flexible connecting means.

It is a further object of this invention to provide a flexible electrical jumper having improved contact ends.

It is still another object of this invention to provide an improved contact strip for a flexible electrical jumper.

It is yet another object of this invention to increase the versatility of a flexible electrical jumper.

It is yet a further object of this invention to provide means for reinforcing the exposed contact ends of a flexible electrical jumper.

It is still a further object of this invention to provide an integral contact strip having a flat resilient central portion and selectively rolled reinforced ends arranged to provide contact means thereat for use in conjunction with a flexible connecting means.

Other objects and features of the invention will be pointed out in the following description and claims and illustrated in the accompanying drawings which disclose by way of example the principle of the invention and the best mode contemplated for carrying it out.

BRIEF DESCRIPTION OF THE DRAWINGS

In the Drawings:

FIG. 1 is a fragmentary perspective view, partly in section, of a flexible connecting means constructed in accordance with the concepts of the invention.

FIG. 2 is a fragmentary top plan view, partly in section, of a portion of the device of FIG. 1.

FIG. 3 is a side elevational view of a contact strip for a flexible connecting means constructed in accordance with the concepts of the invention.

FIG. 4 is a front elevational view, partly in section, taken along the line 4—4 of FIG. 3.

FIG. 5 is a front elevational view, in section, taken along the line 5—5 of FIG. 3.

FIG. 6 is a side elevational view, partly in section, of a portion of the device of FIG. 1 illustrating the flexural characteristics thereof.

FIG. 7 is an enlarged fragmentary side elevational view, partly in section, showing the construction of one end of the device of FIG. 1.

FIG. 8 is an enlarged fragmentary side elevational view, partly in section and similar to FIG. 7, showing a further embodiment of the stiffening means of the contact strip of a flexible connecting device constructed in accordance with the concepts of the invention.

FIG. 9 is an enlarged fragmentary perspective view, partly in section, of the contact means of a contact strip constructed in accordance with the concepts of the invention.

FIG. 10 is an enlarged fragmentary perspective view, partly in section, of a further embodiment of the contact means of a contact strip constructed in accordance with the concepts of the invention.

FIG. 11 is a perspective view, partly in section, showing the device of FIG. 1 employed to interconnect a pair of printed circuit boards.

Similar elements are given similar reference characters in each of the respective drawings.

DESCRIPTION OF THE PREFERRED EMBODIMENTS

Turning now to FIGS. 1 through 7 there is shown a flexible connecting means 20 constructed in accordance with the concepts of the invention and comprising a length of flat flexible dielectric material 22 in which are encased a plurality of thin flat metallic flexible strips 24 formed from such materials as beryllium copper, phosphor bronze, brass, or other like resilient materials having the desired electrical and mechanical characteristics. Each strip 24 comprises a central portion 26 and first and second ends 28 and 30, respectively, defining contact means for engagement with a further member or article. The central portion 26 of the strip 24 is suitably proportioned to be readily flexed without permanent deformation or distortion. The first and second ends 28 and 30, respectively, are rolled or curled to provide either a pin receiving socket such as shown at 32 in FIG. 9, or pin means such as shown at 34 in FIG. 10. To selectively reinforce or rigidify the segment joining each of the first and second ends 28 and 30, respectively, of the strip 24 to its central portion 26, there is provided a stiffening means which may comprise a strut or rib 36 extending between each of the ends 28 and 30 of strip 24 and the central portion 26. The rib 36 may be economically coined or die stamped into the desired shape and length from the body of the strip 24 (See FIG. 5) or may comprise a separate element firmly affixed thereto as by welding, soldering, or other suitable bonding means. The rib 36 may be formed so as to protrude from the upper surface of the strip 24, as shown in FIG. 7, or alternatively, may protrude from the lower surface of the strip 24, as shown at 38 in FIG. 8, either configuration providing essentially the same stiffening effect at the desired location. The rib 36 is formed preferably to have a height above the plane of the strip 24 at least equal to the thickness of the central portion 26. The stiffening rib 36 is aligned preferably coaxial with the longitudinal axis of the strip 24. However, although not shown, two or more such ribs 36 may be provided at each end of the central portion 26 of the strip 24 in a similar manner, each being oriented generally parallel to the longitudinal axis of the strip 24. Each of the strips 24 is placed on the dielectric material 22 which comprises a first lateral end 40 and a second lateral end 42 defining the length of the dielectric material 22. The strips 24 are aligned with the material 22 such that each rib 36 is bisected by an associated end 40, 42. Accordingly, a portion of the length of the rib 36 extends within the material 22 and the remaining portion of the length of the rib 36 extends beyond the material 22, thereby providing further support for the associated exposed end 28, 30 of the strip 24 lying outside of the dielectric material 22. It should be understood that all references to the location and effect of the addition of the rib 36 applies equally to the construction including the rib 38 shown in FIG. 8. It should also be understood that the length of the rib 36 should be such as to extend into the dielectric material 22 sufficiently to provide the necessary rigidity and reinforcement over the required area and to preclude loss of engagement between the rib 36 and the dielectric material 22 when the connecting means 20 is flexed as shown, for example, in FIGS. 6 or 11. Thus, by virtue of the addition of the ribs 36, the flexible connecting means 20 may be readily flexed through an arc of 180 degrees or more by grasping the ends 28 and 30 as shown in FIG. 6, where the thickness of the dielectric material 22 is within reasonable limits compatible with the electrical and mechanical characteristics desired in such devices. As further illustrated in FIG. 11, the flexible jumper or connecting means 20 may thus be advantageously employed to electrically interconnect two members such as printed circuit boards 44 and 46 which are each provided with a series of apertures 48, 50, respectively, each proportioned to receive a respective end 28, 30 of the strips 24. In such case, the ends 28 and 30 are constructed substantially as shown in FIG. 10 to provide pin means 34 for insertion into the apertures 48 and 50. However, either or both ends 28 and 30 of the strip 24 may be curled or rolled to suitable proportions, as described above with respect to FIG. 9 to mate with a pin 48 shown in dotted outline in FIG. 9 which may comprise a terminal of a further electrical component. Two or more flexible connecting means 20 may, accordingly, be serially connected to one another by the simple expedient of providing contact means such as 32 at one end of the member 20 and by providing contact means such as 34 at the other end of the member 20.

The connecting means 20 may be readily manufactured either by molding the dielectric material 22 about the strips 24 in the required length, or by employing a continuous laminating process wherein the dielectric material 22 comprises two sheets of flexible insulating material which are fed to a strip loading zone from suitable storage rolls. The first or underlying sheet may pass over a platen or support and receive the strips 24 thereon at the required spacing and location. The second or overlying sheet of insulating material is then fed over the strips and the two sheets bonded to one another by any suitable means such as heat, pressure, or adhesive bending wherein the strips 24 are thus firmly encapsulated within the laminated structure. Continuous lengths of the flexible connecting means 20 may thus be readily manufactured rapidly and economically. The user may thus choose the width of connecting means desired and sever the desired segment from the remainder of the roll or length. Each segment may thus comprise any number of strips 24 according to a particular application so that one such segment may contain ten pin or socket ends while another segment may contain twenty pin or socket ends, each segment being adapted to mate with a particular electrical element or component having a similar number of receiving apertures or pins. The dielectric material 22 may comprise almost any thermoplastic or thermosetting plastic material well known in the art which may be suitably molded, extruded, or otherwise formed into the desired shape, and which possesses the required flexibility and electrically insulating characteristics.

The embodiments of the invention in which an exclusive property or privilege is claimed are defined as follows:

1. Flexible connecting means comprising: a length of generally flat flexible dielectric material having a first end and a second end, said first and said second ends defining the limits of the length of said dielectric material; and a plurality of thin metallic strips of substantially uniform thickness disposed within said dielectric material and arranged in spaced parallel relationship, each of said strips having a first end, a second end, and a generally flat flexible central portion oriented coplanar with said dielectric material; said first and second ends of said strips each comprising an elongate curled tubular portion to provide a contact means thereat, each of said curled portions being located beyond a respective one of said first and second ends of said flexible dielectric material for connection to a further member, each of said strips further comprising elongate stiffening means in the form of an elongate coined portion deformed out of the plane of said strip and integral therewith, said coined portion being located between each of said curled portions and said central portion of each of said strips to provide a rigid zone thereat, said strips being selectively located in said flexible dielectric material such that said coined portions each extend partially within and partially beyond the limits of the length of said flexible dielectric material as defined by said first and second ends thereof to reduce the flexure of said strips at the juncture between each of said first and second ends thereof and a respective one of said first and second ends of said flexible dielectric material.

2. Flexible connecting means as defined in claim 1 wherein said contact means comprises a pin receiving socket.

3. Flexible connecting means as defined in claim 1 wherein said contact means comprises pin means.

4. Flexible connecting means as defined in claim 1 wherein said coined portions is located along an axis extending substantially coaxial with the longitudinal axis of said strip.

5. Flexible connecting means as defined in claim 1 wherein said dielectric material comprises a laminated structure of two sheets of flexible insulating material joined to one another.

6. Flexible connecting means as defined in claim 5 wherein said sheets are joined to one another by heat bonding.

7. Flexible connecting means as defined in claim 5 wherein said sheets are joined to one another by pressure bonding.

8. Flexible connecting means as defined in claim 5 wherein said sheets are joined to one another by adhesive bonding.

9. Flexible connecting means as defined in claim 1 wherein said first ends of said plurality of strips are each similarly formed to provide a pin receiving socket thereat.

10. Flexible connecting means as defined in claim 9 wherein said second ends of said plurality of strips are each similarly formed to provide a pin receiving socket thereat.

11. Flexible connecting means as defined in claim 9 wherein said second ends of said plurality of strips are each similarly formed to provide pin means thereat.

12. Flexible connecting means as defined in claim 1 wherein said first ends of said plurality of strips are each similarly formed to provide pin means thereat.

13. Flexible connecting means as defined in claim 12 wherein said second ends of said plurality of strips are each similarly formed to provide pin means thereat.

14. Flexible connecting means as defined in claim 1 wherein each of said coined portions have a height above the plane of said strip at least equal to the thickness of said central portion of said strip.

* * * * *